(12) United States Patent
Ogino

(10) Patent No.: US 6,205,047 B1
(45) Date of Patent: Mar. 20, 2001

(54) DATA MEMORY DEVICE HAVING AN EXCLUSIVE-OR FUNCTION AND METHOD OF READING DATA THEREFROM

(75) Inventor: Hiroyuki Ogino, Kyoto (JP)

(73) Assignee: Kyoto University (JP)

( * ) Notice: Subject to any disclaimer, the term of this patent is extended or adjusted under 35 U.S.C. 154(b) by 0 days.

(21) Appl. No.: 09/369,322

(22) Filed: Aug. 6, 1999

(30) Foreign Application Priority Data

Aug. 10, 1998 (JP) .................................................. 10-225649

(51) Int. Cl.⁷ .................................................. G11C 11/22
(52) U.S. Cl. ...................... 365/145; 365/200; 365/189.07
(58) Field of Search .................................... 365/145, 200, 365/189.08, 189.07

(56) References Cited

U.S. PATENT DOCUMENTS 5,999,464 * 12/1999 Hidaka et al. ........................ 365/200

FOREIGN PATENT DOCUMENTS

| 49-15971 | 4/1874 | (JP) . |
| 48-103138 | 12/1973 | (JP) . |
| WO 97/21223 | 6/1997 | (WO) . |

* cited by examiner

*Primary Examiner*—Huan Hoang
(74) *Attorney, Agent, or Firm*—Burns, Doane, Swecker & Mathis, L.L.P.

(57) ABSTRACT

A memory device with an Exclusive-OR function includes memory cells for storing a data of true or false value. Input data is written into at least one selected memory cell separately or simultaneously as a positive or negative logic. The stored data is read from at least one selected memory cell separately or simultaneously, e.g., as a positive logic data if an identity-retrieval data has a true value, and as a negative logic data if the identity-retrieval data has a false value.

13 Claims, 15 Drawing Sheets

DATA MEMORY DEVICE HAVING AN EXCLUSIVE-OR FUNCTION AND METHOD OF READING DATA THEREFROM

BACKGROUND OF THE INVENTION

1. Field of the Invention

The present invention relates to a data memory device having an Exclusive-OR function and a method of reading the stored data therefrom for retrieving or answering queries relating to identity/non-identity, which are required for database processing, image processing, word processing or the like.

2. Description of the Related Art

A functional memory having both a storage element and an functional circuit serves not only to store at least one data but also to simultaneously perform various sorts of computation. The functional memory is used, for example, as associative memory, logic-in-memory, distributed logic memory, etc. Furthermore, the associative memory by way of example is used as content addressable memory, data address memory, search memory, etc. It is generally recognized that this kind of functional memory is proposed for the first time in "The Cryotron Catalog Memory System" by Slade and McMahon published in 1956. There have been further proposed a data storage by utilizing magnetism of magnetic core (1961) or magnetic bubbles, as well as a data memory in which a semiconductor flip-flo circuit is combined with an identity circuit (E. S. Lee; 1963). However, these memories have not been mass produced due to various reasons. For example, in the case of magnetic core, an coincident-current selection control is required which makes it difficult to control the destructive readout and non-destructive readout and thus necessitates the stored data to be read in a destructive readout mode in which the retrieval rate of the data is relatively low.

The functional memory can be used not only in small scale applications such as address conversion in a virtual memory, memory mapping in a cash memory, conversion of symbolic address, but also retrieve or answer queries relating to identity/non-identity, which are required for database processing, image processing, word processing or the like. However, despite the long history and practical importance of the functional memory, there has been no marked breakthrough matched for large scale applications, beyond a small scale memory for limited applications.

On the other hand, since a main memory is highly important element for the development of computers, research and development in respect of semiconductor RAM (Random Access Memory) have been devoted. As a result of rapid progress in the RAM technology, which became particularly drastic upon appearance of DRAM (Dynamic Random Access Memory), it can be composed of a single memory cell in the form of a capacitor storing charges and a single transistor, and can be made extremely compact to occupy a minimized area.

Since the functional memory comprises a memory cell and an functional element, as mentioned above, and the memory cell is typically composed of at least one SRAM (Static Random Access Memory) and/or DRAM as used in a main memory, the elements of a functional memory is always larger in number than those of SRAM or DRAM and thus occupy a larger area. For such reason, it has been considered more general and economical to perform data processing by using, instead of a dedicated functional memory, a main memory in combination with an functional circuit with the sacrifice of the processing speed. Such recognition in the art has been a prejudicial factor to the development of advanced functional memories.

Memories having a small number of elements and a large storing capacity are being under development, based on flush memory technology or memory elements similar to flush memory but using a plurality of threshold values. In this case, however, it is inevitable that the number of the elements is twice as much as that of DRAM, besides that the data writing rate is insufficient. As a result, such memories still do not have high speed and large storing capacity as comparable to those in DRAM or SRAM.

The arrangement of functional memory cells can be classified into WPBP (Word Parallel Bit Parallel) mode and WPBS (Word Parallel Bit Serial) mode. While the WPBP mode is capable of performing all calculations based on a single instruction, the calculations are practically divided in terms of reading out of the calculated results or in view of power consumption, following the progressive integration of the memory cells.

While various functional memories have been so far proposed, as explained above, it is recognized that a further progress in the integration of functional memories requires (i) a simple structure similar to semiconductor memory which is comprised of a single transistor and a single memory cell, (ii) a WPBS operation similar to the WPBP mode which allows parallel operations within allowable data transfer rate and power consumption, and (iii) a functional limitation to simple calculations for retrieval of identity/non-identity or Exclusive-OR operation with a modulo-2 adding operation.

DISCLOSURE OF THE INVENTION

It is an object of the present invention to provide a data memory device having an Exclusive-OR function and a method of reading a data therefrom which can perform an Exclusive-OR operation of the data written into at least one memory cell of at least one functional memory and the identity-retrieval data with a small number of element.

According to the present invention, there is provided a method of reading a data memory device having an Exclusive-OR function, the device being adapted to calculate an Exclusive-OR of a data written into a storing section of at least one memory cell, and an identity-retrieval data, the method comprising the step of: reading the data written into the storing section as one of a positive logic data and a negative logic data if the identity-retrieval data has a true value, and as the other of the positive and negative logic data if the identity-retrieval data has a false value.

According to the invention, if the identity-retrieval data has a true value, the data written into the storing section is read as one of positive logic data and negative logic data. For example, the data are represented as the positive logic in which the true value thereof is 1 and the false value thereof is 0. In other words, if the data written into the data storing section as the positive logic is read as the positive logic, the data read from the memory cell (i.e. results of logical operation) is 1 when the identity-retrieval data is 1 and the data written into the data storing section is 0, and the data read from the memory cell is 0 when the identity-retrieval data is 1 and the data written into the data storing sections is 1.

On the other hand, if the identity-retrieval data has a false value, the data written into the data storing section is read as the data opposite to the data written into the data storing section. If the data is represented as the positive logic in which the true value is 1 and the false value is 0, the data read from the memory cell is 0 when the identity-retrieval data is 0 and the data written into the data storing section is 0, and the data read from the memory cell is 1 when the identity-retrieval data is 0 and the data written into the data storing section is 1.

By reading the data written into the data storing section as the positive logic data or the negative logic data according to the true value or the false value of the identity-retrieval data, it is possible to perform the Exclusive-OR operation of the data written into the data storing section and the identity-retrieval data without having an additional Exclusive-OR operation circuit in the memory cell.

If the data is represented as the negative logic in which the true value thereof is 0 and the false value thereof is 1, or if the data written into the data storing section as the negative logic is read as the negative logic, same result is obtained.

In this description, "positive reading" means that the data written into the data storing section as the positive logic is read as the positive logic or the data written into the data storing section as the negative logic is read as the negative logic, and "negative reading" means that the data written into the data storing section as the positive logic is read as the negative logic or the data written into the data storing section as the negative logic is read as the positive logic.

Preferably, the method further comprises the steps of: comparing, when the identity-retrieval data has a true value, a potential of the storing section with a first reference potential and outputting a true value if a difference is detected between the potential of the storing section and the reference potential, and outputting a false value if a difference is not detected between the potential of the storing section and the first reference potential; and comparing, when the identity-retrieval data has a false value, the potential of the storing section with a second reference potential having a polarity which is opposite to that of the first reference potential, and outputting a true value if a difference is detected between the potential of the storing section and the second reference potential, and outputting a false value if a difference is not detected between the potential of the storing section and said second reference potential.

In this case, when the identity-retrieval data has a true value, a potential of the storing section is compared with a first reference potential and a true value is output if a difference is detected between the potential of the storing section and the reference potential, and a false value is output if a difference is not detected between the potential of the storing section and the first reference potential.

On the other hand, when the identity-retrieval data has a false value, the potential of the storing section is compared with a second reference potential having a polarity which is opposite to that of the first reference potential, and a true value is output if a difference is detected between the potential of the storing section and the second reference potential, and a false value is output if a difference is not detected between the potential of the storing section and said second reference potential. In other words, a logical sum of a logical product of an affirmation of the data written into the storing section and a negation of the identity-retrieval data, as well as a logical product of a negation of the data written into the storing section and an affirmation of the identity-retrieval data, are output.

As the true value or the false value is output in accordance with the presence of the potential difference in such a way, it is possible to perform the Exclusive-OR operation of the data written into the storing section and the identity-retrieval data without having an additional Exclusive-OR operation circuit in a memory cell.

The method may further comprises the steps of: comparing, when the identity-retrieval data has a true value, a potential of the storing section with a first reference potential and outputting one of a false value if a difference is detected between the potential of the storing section and the first reference potential, and outputting a true value if a difference is not detected between the potential of the storing section and the first reference potential; and comparing, when the identity-retrieval data has a false value, the potential of the storing section with a second reference potential having a polarity which is opposite to that of the first reference potential, and outputting one of a false value if a difference is detected between the potential of the storing section and the second reference potential, and outputting a true value if a difference is not detected between the potential of the storing section and the second reference potential.

According to the present invention, there is provided a memory device having an Exclusive-OR function, comprising: storing means having memory cells, each of which having a storing section adapted to store a data as one of a true value and a false value; input means through which the data to be stored in at least one of the memory cells and an identity-retrieval data are input; writing means for writing the data, input through the input means, into at least one of the memory cells separately or simultaneously, as one of a positive logic and a negative logic; reading means for reading the data stored in at least one of the memory cells separately or simultaneously; selecting means for selecting at least one of said memory cells from which the data is to be read, and at least one of the memory cells in which the data is to be stored; and output means for outputting the data read by said reading means; the reading means being adapted to read the data stored in the storing section as one of the positive logic data and the negative logic data if the identity-retrieval data has a true value, and as the other of the positive data and the negative logic data if said identity-retrieval data has a false value.

According to the invention, as shown in FIG. 1, when the data to be stored in at least one of memory cells 2 in the storing means 1 and the identity-retrieval data are input to the data input means 3, the selection means 4 select at least one memory cell 2 in which the data is to be stored. Then, the writing means 5 write the data to be stored in at least one of the memory cells 2 selected separately or simultaneously as one of the positive logic and the negative logic.

When at least one of the memory cells 2 is selected by the selection means 4 in which the identity-retrieval data and a flag for partial retrieval are given, the reading means 6 read the data written into the storing section 7 in at least one of the memory cells 2 corresponding to the identity-retrieval data as the data of one of the positive logic and the negative logic if the identity-retrieval data having the true value are read. On the other hand, if the identity-retrieval data having the false value are read, the reading means 6 read the data written into the data storing section 7 in at least one of the memory cells 2 corresponding to the identity-retrieval data as the data of the other of the positive logic and the negative logic. The data being read are output from the data output means 8.

By reading the data written into the data storing section 7 as one of the data of the positive logic and the negative logic according to the true value or the false value of the identity-retrieval data for in such a way, it is possible to perform the Exclusive-OR operation of the data written into the data storing section 7 and the identity-retrieval data without having an additional Exclusive-OR operation circuit in the memory cell 2.

Preferably, the reading means is adapted to compare, when the identity-retrieval data has a true value, a potential of said storing section with a first reference potential and output a true value if a difference is detected between the potential of the storing section and the first reference potential, and output a false value if a difference is not detected between the potential of the storing section and the first reference potential, and is also adapted to compare, when the identity-retrieval data has a false value, the potential of the storing section with a second reference potential having a polarity which is opposite to that of the first reference potential, and output a true value if a difference is detected between the potential of the storing section and the second reference potential, and output a false value if a difference is not detected between the potential of the storing section and the second reference potential.

According to this embodiment, the reading means 6 (FIG. 1) is adapted to compare, when the identity-retrieval data has a true value, a potential of the storing section 7 (FIG. 1) with a first reference potential and output a true value if a difference is detected between the potential of the storing section and the first reference potential, and output a false value if a difference is not detected between the potential of the storing section and the first reference potential.

On the other hand, the reading means 6 (FIG. 1) is adapted to compare, when the identity-retrieval data has a false value, the potential of the storing section 7 (FIG. 1) with a second reference potential having a polarity which is opposite to that of the first reference potential, and output a true value if a difference is detected between the potential of the storing section and the second reference potential, and output a false value if a difference is not detected between the potential of the storing section and the second reference potential.

As the true value or the false value is output in accordance with the presence of the potential difference in such a way, it is possible to perform the Exclusive-OR operation of the data the data storing section 7 (FIG. 1) and the identity-retrieval data without having an additional Exclusive-OR operation circuit in the memory cell 2 (FIG. 1).

The reading means may be adapted to compare, when said identity-retrieval data has a true value, a potential of said storing section with a first reference potential and output one of a false value if a difference is detected between said potential of the storing section and said first reference potential, and output a true value if a difference is not detected between said potential of the storing section and said first reference potential, and is also adapted to compare, when said identity-retrieval data has a false value, the potential of said storing section with a second reference potential having a polarity which is opposite to that of said first reference potential, and output one of a false value if a difference is detected between said potential of the storing section and said second reference potential, and output a true value if a difference is not detected between said potential of the storing section and said second reference potential.

Preferably, it further comprises current control means for controlling a current therethrough in both directions when the data is read from the storing section or written into the storing section.

According to this embodiment, By using such current control means, it is possible to perform the reading of the data from the storing section 7 (FIG. 1) and the writing of the data into the storing section (FIG. 1).

The current control means comprises a MOS transistor, a CMOS, or a first conductive type of a transistor and a second conductive type of a transistor.

Preferably, the storing section comprises a ferromagnetic body for holding the data of the true value or the false value according to a magnetizing direction or a magnetizing strength thereof; the writing means being adapted to write the data into the storing section separately or simultaneously in accordance with an electromagnetic induction generated by the ferromagnetic body; and the reading means being adapted to read the data from the storing section separately or simultaneously in accordance with the electromagnetic induction.

According to this embodiment, the storing section 7 (FIG. 1) comprises a ferromagnetic body for holding the data of the true value or the false value according to a magnetizing direction or a magnetizing strength thereof. In this case, the writing means 5 (FIG. 1) write the data into the storing section 7 (FIG. 1) separately or simultaneously in accordance with electromagnetic induction. The reading means 6 (FIG. 1) read the data from the storing section 7 (FIG. 1) separately or simultaneously in accordance with the electromagnetic induction.

As the storing section 7 (FIG. 1) has the non-volatile property by comprising the ferromagnetic body, the non-destructive readout can be achieved result from the non-volatile property. Because of the asymmetric property in which data can be read more rapidly, it is possible to operate rapidly if the memory is used as the functional memory, it is possible to shorten the delay time between a cache memory and the main memory if it is used as the main memory. If the memory has a large amount of storage, it can be used in place of the magnetic disc, through, without occurrence of a large delay time between the main memory and a secondary storage. Therefore, the memory in a system can perform a fast storage action. Further if it is formed on an integrated circuit, such memory cells can be formed to have a desired two or three-dimensional form, so that the memory can have a large amount of storage. Moreover, by storing the data of the true value or the false value according to the magnetizing direction or magnetizing strength, the memory is not erased even if the power supply is turned-off, so that the memory can have the non-volatile property.

If the storing section 7 (FIG. 1) comprises the ferromagnetic body, the readout mode by the data reading means 6 (FIG. 1) is not only a non-destructive mode in which the data in the storing section 7 (FIG. 1) is not destructed even if the data therein is read, but also a destructive readout mode in which the data in the storing section 7 (FIG. 1) is destructed once the data therein is read. In the case where the destructive mode is performed, the reading time by the reading means 6 (FIG. 1) becomes symmetric to the writing time by the writing means 5 (FIG. 1), so that the output from the data output means 8 (FIG. 1) makes stronger. On the other hand, in the case where the non-destructive mode is performed, the reading time by the reading means 6 (FIG. 1) becomes asymmetric to the writing time by the writing means 5 (FIG. 1). As a result, the time required to read the data can make much smaller than that required to write the data.

Preferably, one of the true value and the false value corresponds to a first residual magnetism with a magnetic field in the ferromagnetic body being zero, and the other of the true value and the false value corresponds to a second residual magnetism with the magnetic field in the ferromagnetic body being zero, wherein the magnetizing strength of the first residual magnetism is substantially same as that of the second residual magnetism and the first residual magnetism has a sign which is opposite to that of the second residual magnetism.

In this case, one of the true value and the false value corresponds to a first residual magnetism with a magnetic field in the ferromagnetic body being zero, and the other of the true value and the false value corresponds to second residual magnetism with a magnetic field in the ferromagnetic body being zero. In other words, the magnetizing direction is changed by the movement of the magnetic domain wall. In this case, the sign of the first residual magnetism is opposite to that of the second residual magnetism.

By determining the data of the true value or the false value using 1-bit in accordance with the first residual magnetism or the second residual magnetism in such a way, high-speed, mass-storing and non-volatile functions can be achieved.

Preferably, the ferromagnetic body comprises a ferromagnetic thin film having a first magnetization vector corresponding to one of the true value and the false value, and a second magnetization vector corresponding to the other of the true value and the false value and having a direction opposite to that of the first magnetization vector.

By determining the data of the true value or the false value using 1-bit in accordance with the first easy axis of magnetization or the second easy axis of magnetization, i.e. rotation of the easy axis of magnetization in such a way, high-speed, mass-storing and non-volatile functions can be achieved.

Preferably, the storing section comprises a ferroelectric body for holding the data of the true value or the false value according to a direction of polarization of the ferroelectric body.

In this case, it is possible to determine the data of the true value or the false value according to direction of polarization.

The storing section may comprise a dielectric body for holding the data of the true value or the false value according to a direction of polarization of the dielectric body.

Preferably, the storing section comprises a flip-flo
for holding the data of the true value or the false value according to a conductive condition and an interrupting condition of the flip-flop.

According to this embodiment, it is possible to have less number of the element than that of the prior functional memory which perform the Exclusive-OR operation.

DESCRIPTION OF THE PREFERRED EMBODIMENTS

Embodiments of the device having an Exclusive-OR function and the method of the same will be explained below with reference to the accompanying drawings.

Figure 1:
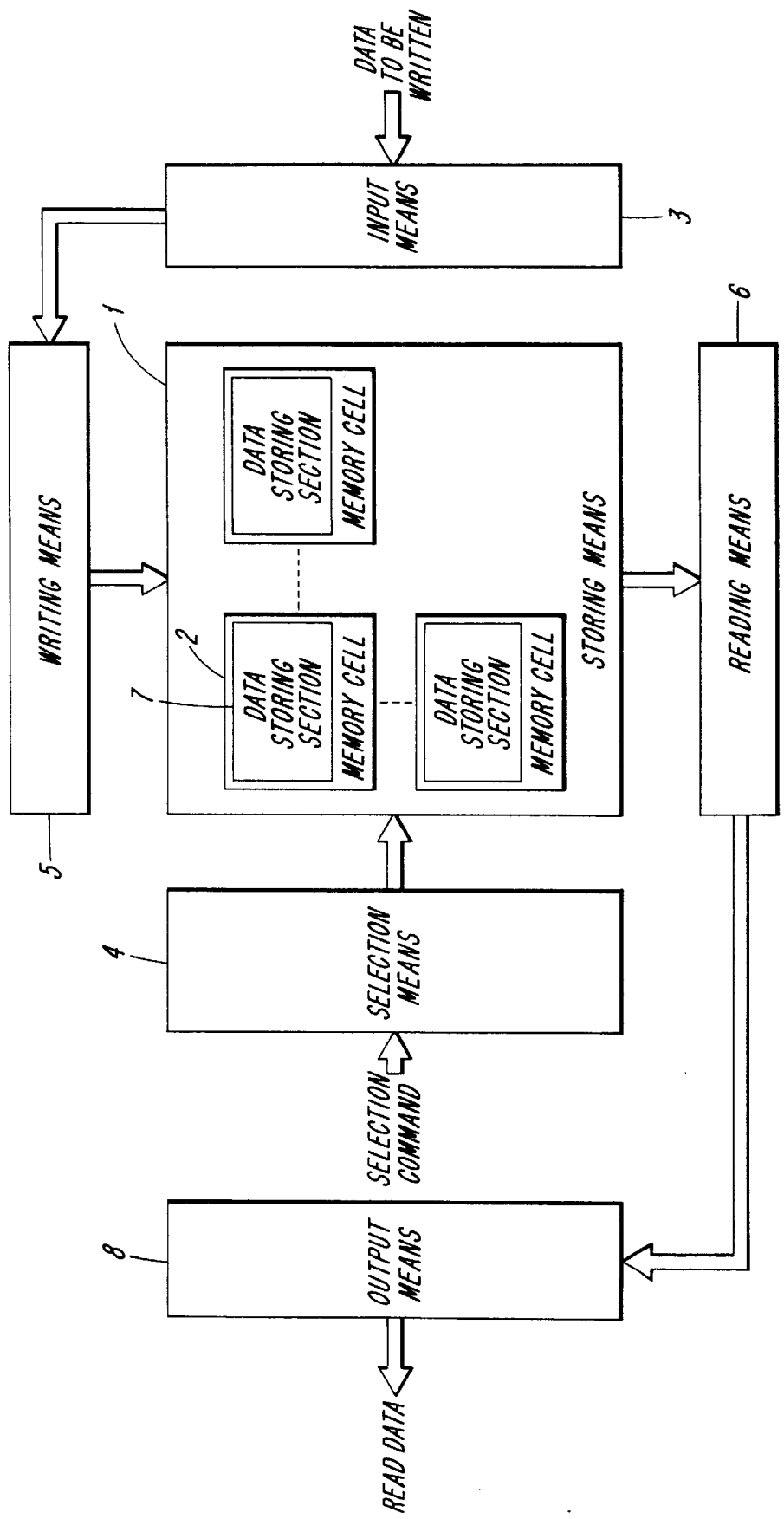
FIG. 1 is a schematic diagram showing the general arrangement of the device according to the invention.
Figure 2:
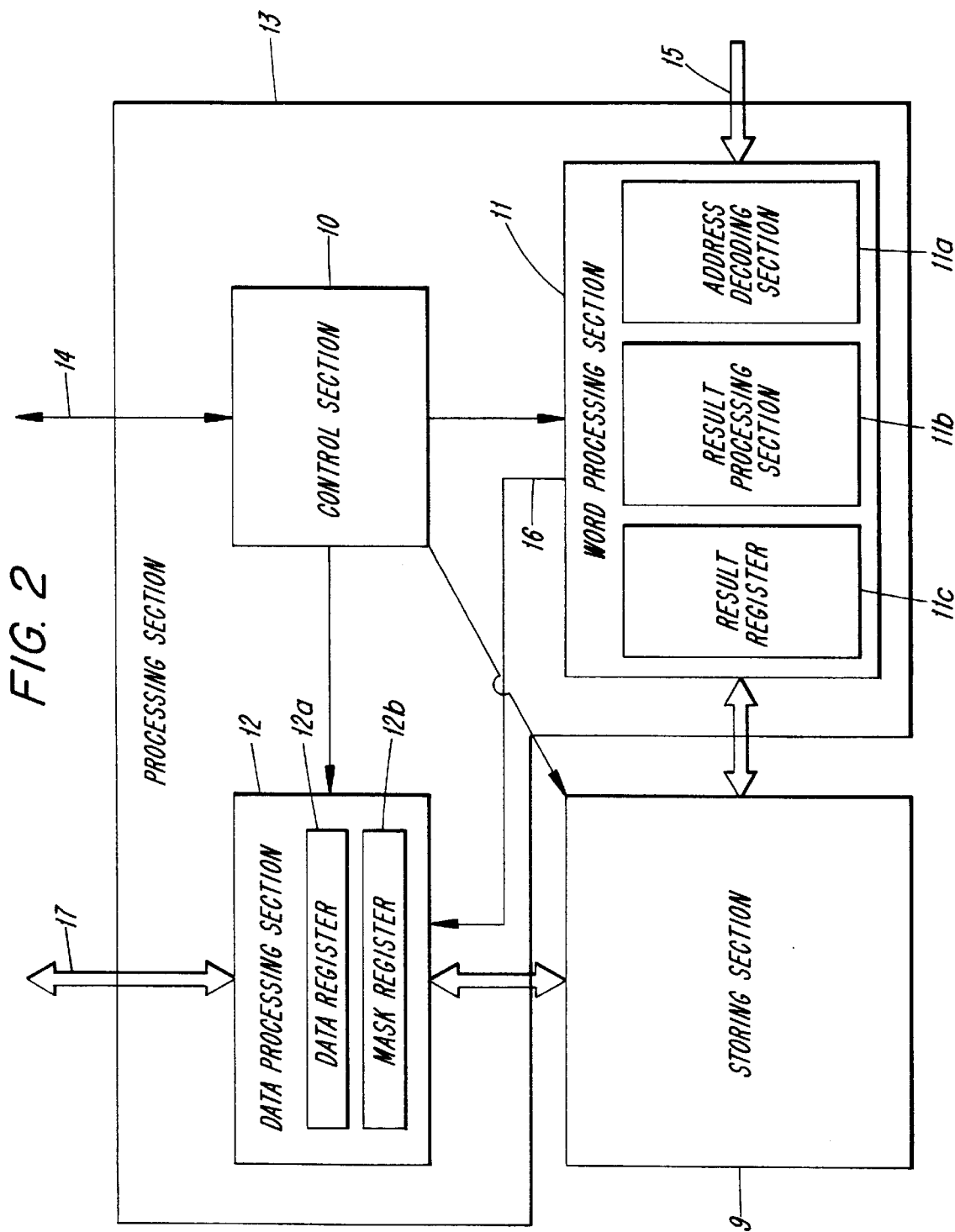
FIG. 2 is a schematic diagram showing the embodiment of the device according to the invention.

FIG. 2 is a schematic diagram showing the embodiment of the device according to the invention.

This device comprises a storing section 9 having a memory cells array (not shown), each of which stores a data of one of a true value and a false value, and a peripheral section (not shown), as well as a processing section 13 having a control section 10, a word processing section 11 and a data processing section 12.

The control section 10 controls the operation of the storing section 9, the word processing section 11 and the data processing section 12 by one or more control commands through a control line 14 connected to one or more external computers and/or various equipment (not shown).

The word processing section 11 has an address decoding section 11a, a result processing section 11b and a result register 11c. The address decoding section 11a receives one or more addresses through address lines 15 connected to one or more external computers and/or various equipment (not shown), and decodes one or more addresses so as to select the address of a memory cell (not shown) of the storing section 9. The result register 11c stores one or more results of the Exclusive-OR (This arithmetic will be explained hereinafter.) obtained per word unit at one time, with multiple partition or in the singular from the address direction of the memory cell so as to being able to refer from the result processing section 11b. The result processing section 11b detects or counts the change of the reading of the result to obtain the answer of the whole identity/non-identity from the result of the identity/non-identity in the result register 11c using an identity detection circuit (not shown). The answer is transmitted to the data processing section 12 through an result line 16 and sent to external through data lines 17.

The data processing section 12 has a data register 12a and a mask register 12b, and sets the data and a mask input from the data lines 17 to the data register 12a and the mask register 12b, respectively. It perform a writing operation in accordance with one or more address selection signal from the word processing section 11 so that a pair of data selection line (not shown) corresponds to the data.

Figure 3:
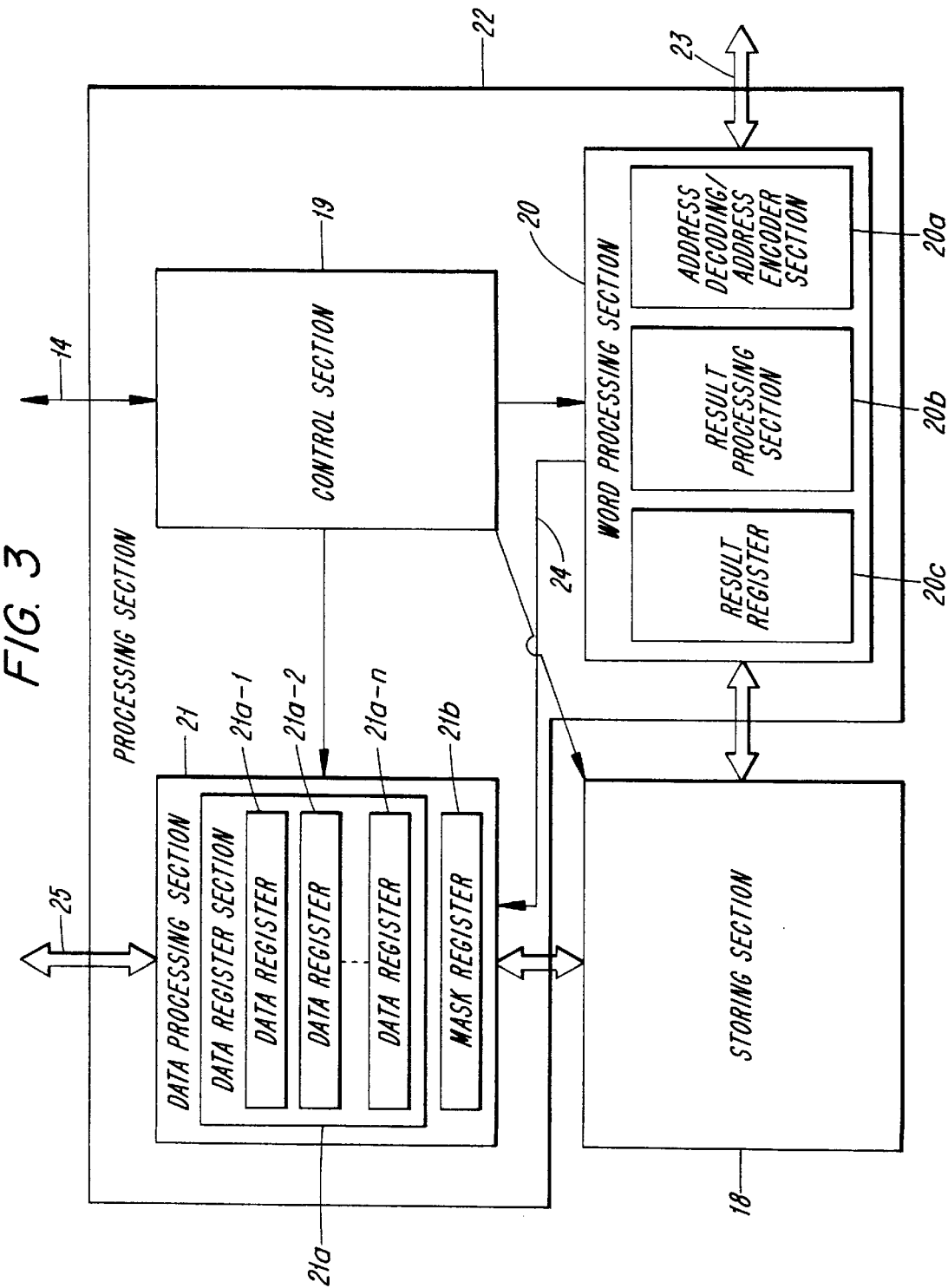
FIG. 3 is a schematic diagram showing another embodiment of the device according to the invention.

FIG. 3 is a schematic diagram showing another embodiment of the device according to the invention.

It can detect the identity/non-identity, process an Exclusive-OR or the result of modulo-2 adding operation, and perform complicated operations such as the specification of the portion of the identity/non-identity, the answering the address and the reference pointer thereof.

The device also comprises a storing section 18 having a memory cells array (not shown), each of which memorizes a data of a true value or a false value, and a peripheral section (not shown), as well as a processing section 22 having a control section 19, a word processing section 20 and a data processing section 21 and being able to detect the identity/non-identity. The storing section 18 and the control section 19 have same construction and operation as those of the storing section 9 and the control section 10 shown in FIG. 2, respectively.

The word processing section 20 has an address decoding/address encoding section 20a, an result processing section 20b and an result register 20c. The address decoding/address encoding section 20a receives one or more addresses through address lines 23 connected to one or more external computers and/or various equipment (not shown), decodes one or more addresses so as to select the address of a memory cell (not shown) of the storing section 18, and obtains and encodes one or more reference pointers corresponding to respective addresses so as to send one or more answers from data lines 25 through the address lines 23 or an result line 24. The result processing section 20b separates the result of the result register 20c to specify one or more addresses of the identity/non-identity.

The data processing section 21 has a data register 21a and a mask register 21b. The data register 21a has data registers 21a-1 to 21a-n, reads the operated data in the storing section 18 and exchange or change the data.

Figure 4:
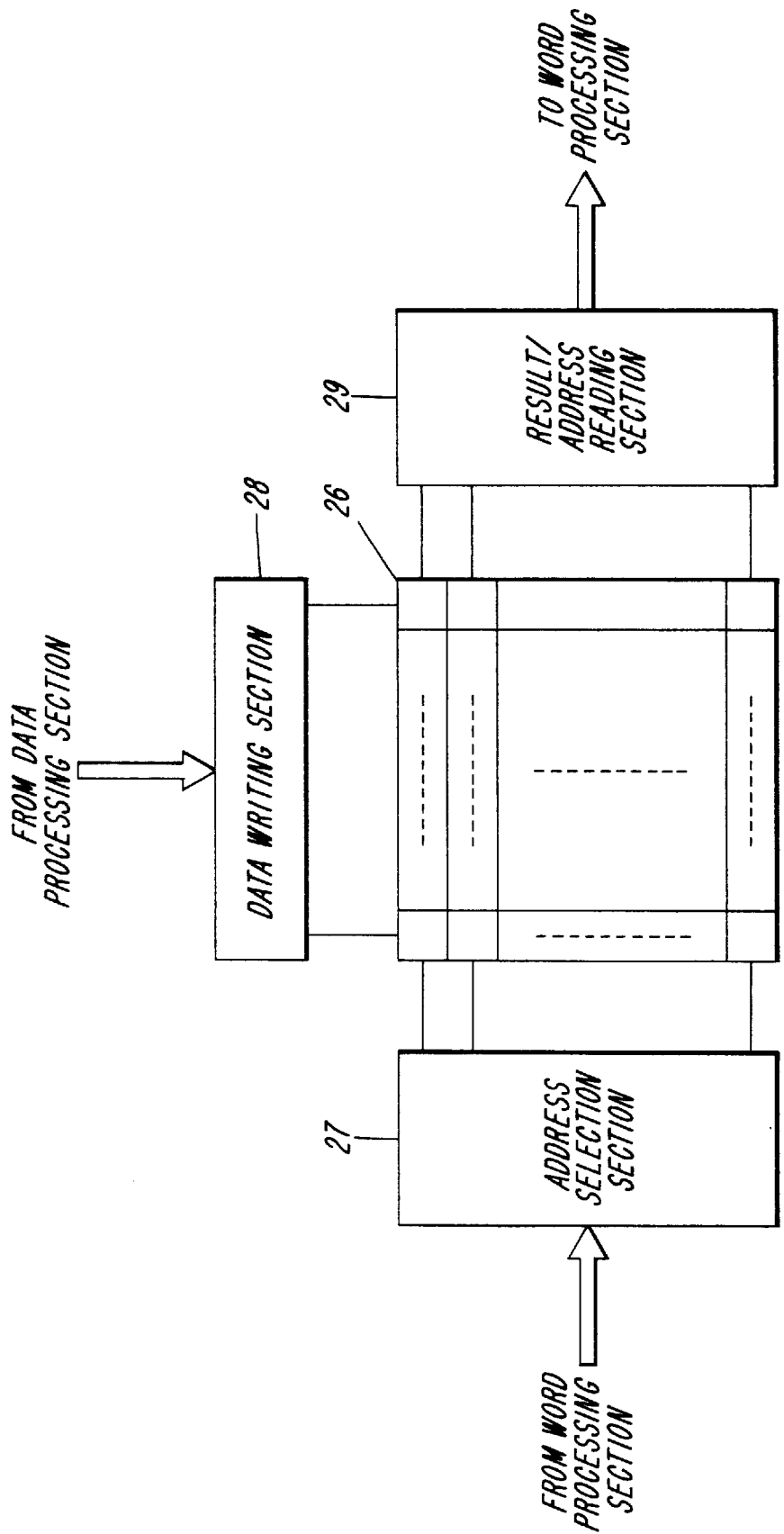
FIG. 4 is a schematic diagram showing a first storing section in the device according to the invention.

FIG. 4 is a schematic diagram showing a first storing section in the device according to the invention. A storing section thereof corresponds to the storing section 9 in FIG. 2 and the storing section 18 in FIG. 3, respectively, and has a memory cells array 26, an address selection section 27 which selects the address in accordance with an address signal received from the word processing section 11 (FIG. 2) or 20 (FIG. 3), a data writing section 28 which writes the data to be written into the memory cell 26 in accordance with the selection of the address selection section 27, and an result/address reading section 29 which reads the result as explained hereinafter and the address. The data to be written into the memory cell 26 is supplied from the data processing section 12 (FIG. 2) or 21 (FIG. 3). The result/address reading section 29 detects or counts the change at one time, with multiple partition or in the singular by operating with regarding one memory cell 26 as one word unit to gather one or more results as the set of addresses and supply them to the word processing section 11 (FIG. 2) or 20 (FIG. 3).

Figure 5:
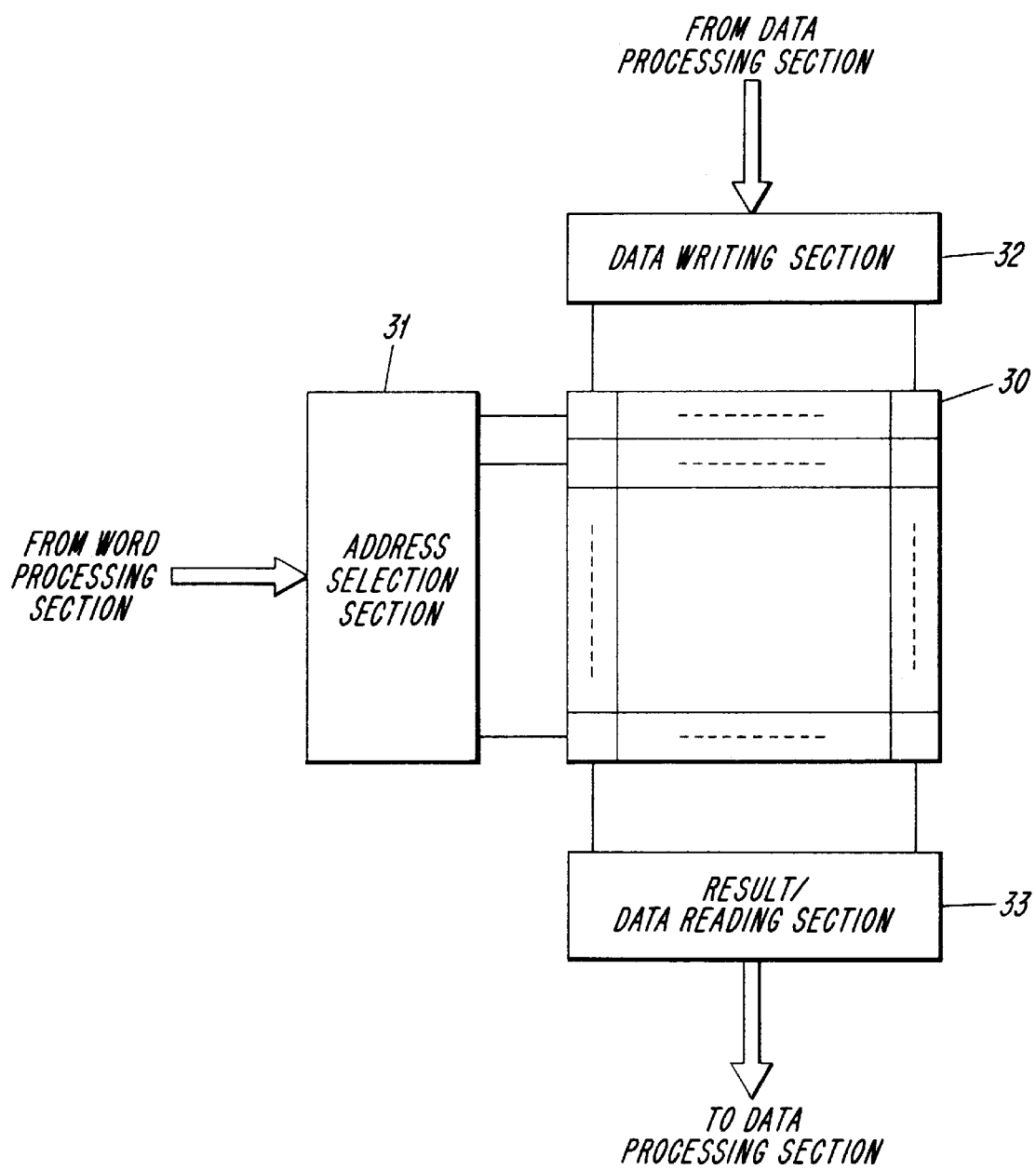
FIG. 5 is a schematic diagram showing a second storing section in the device according to the invention.

FIG. 5 is a schematic diagram showing a second storing section in the device according to the invention. This storing section corresponds to the storing section 9 in FIG. 2 and the storing section 18 in FIG. 3, respectively, and has a memory cells array 30, an address selection section 31 which selects the address in accordance with the address signal received from the word processing section 11 (FIG. 2) or 20 (FIG. 3), a data writing section 32 which writes the data to be written into the memory cell 30 in accordance with the selection of the address selection section 31, and an result/data reading section 33 which reads the result as explained hereinafter and the data. The data to be written into the memory cell 30 is supplied from the data processing section 12 (FIG. 2) or 21 (FIG. 3). The result/data reading section 33 detects or counts the change at one time, with multiple partition or in the singular by operating with regarding one memory cell 30 as one word unit to gather one or more results as the set of addresses and supply them to the data processing section 12 (FIG. 2) or 21 (FIG. 3).

Figure 6:
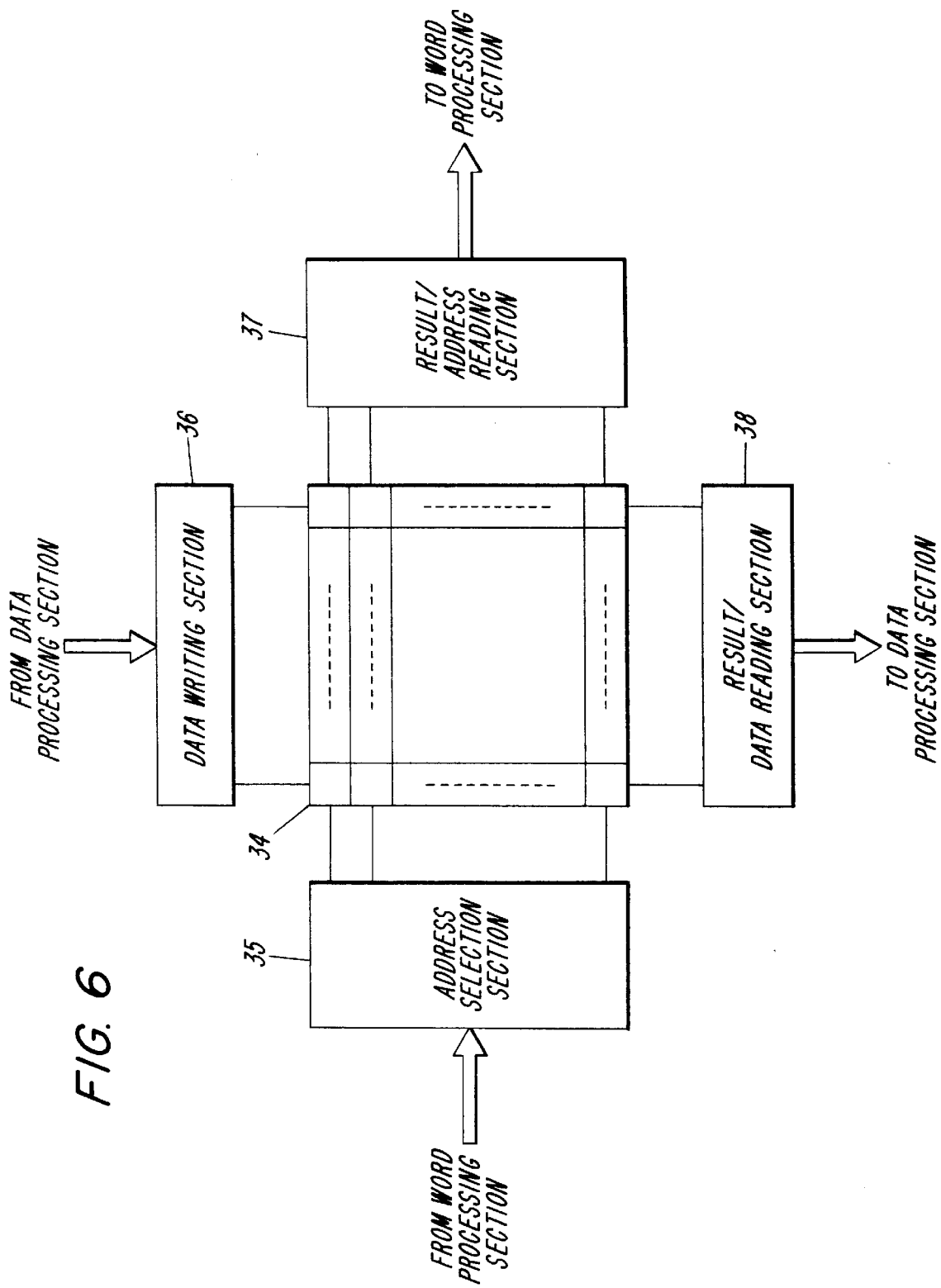
FIG. 6 is a schematic diagram showing a third storing section in the device according to the invention.

FIG. 6 is a schematic diagram showing a third storing section in the device according to the invention. This storing section corresponds to the storing section 9 in FIG. 2 and the storing section 18 in FIG. 3, respectively, and has a memory cells array 34, an address selection section 35 which selects the address in accordance with the address signal received from the word processing section 11 (FIG. 2) or 20 (FIG. 3), a data writing section 36 which writes the data to be written into the memory cell 34 in accordance with the selection of the address selection section 35, an result/address reading section 37 which reads the result as explained hereinafter and the addresses, and an result/data reading section 38 which reads the result as explained hereinafter and the data. The data to be written into the memory cell 34 is supplied from the data processing section 12 (FIG. 2) or 21 (FIG. 3). The result/address reading section 37 detects or counts the change at one time, with multiple partition or in the singular by operating with regarding one memory cell 34 as one word unit to gather one or more results as the set of addresses and supply them to the data processing section 12 (FIG. 2) and 21 (FIG. 3). The result/data reading section 38 detects or counts the change at one time, with multiple partition or in the singular by operating with regarding one memory cell 34 as one word unit to gather one or more results as the set of addresses and supply them to the data processing section 12 (FIG. 2) or 21 (FIG. 3). In this case, by providing the result/address reading section 37 and the result/address reading section 38, it is possible to process a complicated result rapidly.

Figure 7:
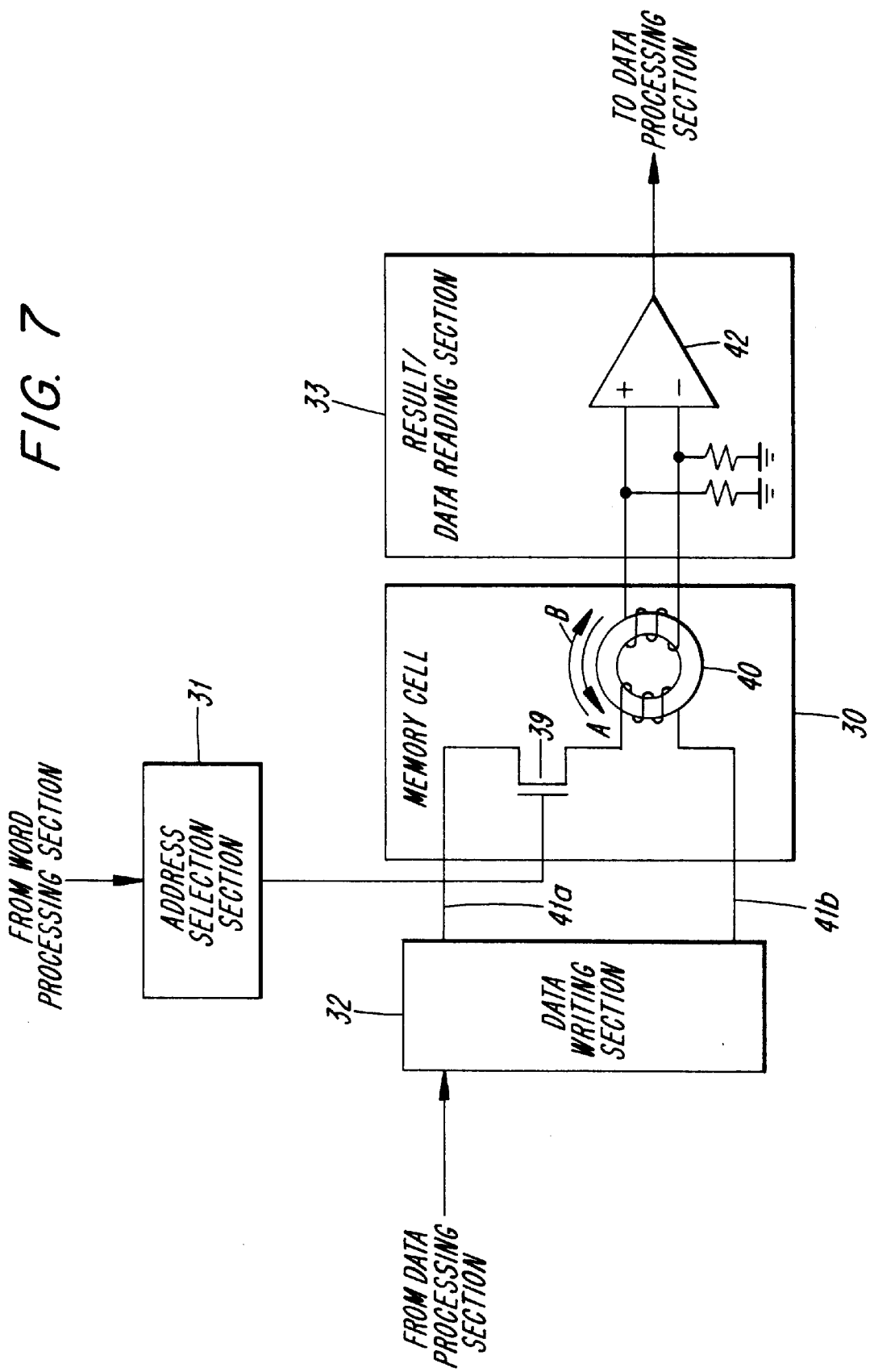
FIG. 7 is a schematic diagram showing an example of the storing portion shown in FIG. 5.

FIG. 7 is a schematic diagram showing an example of the storing portion shown in FIG. 5. The operation of the device and the method according to the invention will be explained with reference to FIG. 7. In FIG. 7, same reference numerals as those in FIG. 5 are use, but only one memory cell 30 is shown for simplicity.

In this example, the memory cell 30 has an NMOS transistor 39, and a ferromagnetic body 40 (e.g. permalloy) which composes a magnetic circuit by being wound with a lead wire connected to the NMOS transistor 39. (For example, the ferromagnetic body 40 has a structure which can be magnetized in circular direction. It is preferable to have such a structure from a point of view of integration.)

When a row and an array corresponding the magnetic memory cell 30 is written into an address attached to the memory cell 30 as a unit called word, the data writing section 32 prepares a data composed of a single or multiple bit, selects the memory cell 30 to which the data is to be written by the address selection section 31, and writes the data into a corresponding ferromagnetic body 40 through corresponding data lines 41a and 41b connected to a source and a drain of the corresponding NMOS transistor 39. When reading the data, current is supplied from the data writing section 32 as a power supply of the data writing to respective data lines 41a and 41b, the memory cell 30 from which the data is to be read is selected, and the memory cell 30 prepares for reading the data.

The result/data reading section 33 has at least one sense amplifier 42(In FIG. 7, only one sense amplifier is shown for simplicity.). A non-inverting input and an inverting input thereof are connected to a lead wire wound on the corresponding ferromagnetic body 40. An output thereof is connected to the word processing section 11 (FIG. 2) or 20 (FIG. 3).

Before using the memory cell 30, an initialization thereof is performed as shown in Table 1.

TABLE 1

| Erase data | Memory content before initialization | Transition of memory content | Memory content after initialization |
|---|---|---|---|
| 0 | 0 | 0 | 0 |
|   | 1 | 1 → 0 |   |

In this case, the data is represented as the positive logic in which the true value thereof is 1 and the false value thereof is 0. Normally, in the operation of the memory cell 30, the logic of the data written into the ferromagnetic body 40 is same as that read therefrom. The data represented as the positive logic is stored in the ferromagnetic body 40 by the writing operation as shown in Table 2.

TABLE 2

| Writing data | Memory content before writing | Transition of memory content | Memory content after writing |
|---|---|---|---|
| 0 | 0 | 0 | 0 |
|   | 1 | 1 → 0 |   |
| 1 | 0 | 0 → 1 | 1 |
|   | 1 | 1 |   |

When reading the data, the ferromagnetic body 40 is driven by performing the operation opposite to the writing operation thereof so as to read the data stored into the memory cell 30. The reading operation thereof is performed as shown in Table 3.

TABLE 3

| Reading data | Memory content before reading | Transition of memory content | Read data |
|---|---|---|---|
| 0 | 0 | 0 | 0 |
|   | 1 | 1 → 0 | 1 |

The readout mode of the data thereof may be a destructive readout mode or a non-destructive readout mode. If the destructive readout mode is performed, it is necessary to restore the memory content thereof by rewriting the data after reading the data because the memory content is destroyed at the same time it is performed. Such a rewriting operation is performed as shown in Table 4.

TABLE 4

| Rewriting data | Memory content after reading | Transition of memory content | Restored memory content |
|---|---|---|---|
| 1 | 0 | 0 → 1 | 1 |

Next, the Exclusive-OR operation will be explained. If the data written into the ferromagnetic body 40 is read positively, or the data written into the ferromagnetic body 40 as the positive logic is read as the positive logic, the result as shown in Table 5 will be obtained.

TABLE 5

| Reading data | Memory content before reading | Transition of memory content | Read data |
|---|---|---|---|
| 0 | 0 | 0 | 0 |
|   | 1 | 1 → 0 | 1 |

In the case of the destructive readout mode, it is necessary to perform rewriting operation as shown in Table 6.

TABLE 6

| Rewriting data | Memory content after reading | Transition of memory content | Restored memory content |
|---|---|---|---|
| 1 | 0 | 0 → 1 | 1 |

If the data written into the ferromagnetic body 40 is read negatively, or the data written into the ferromagnetic body 40 as the positive logic is read as the negative logic, the result as shown in Table 7 will be obtained.

TABLE 7

| Reading data | Memory content before reading | Transition of memory content | Read data |
|---|---|---|---|
| 0 | 0 | 0 → 1 | 0 |

In the case of the destructive readout mode, it is necessary to perform rewriting operation as shown in Table 8.

TABLE 8

| Rewriting data | Memory content after reading | Transition of memory content | Restored memory content |
|---|---|---|---|
| 0 | 1 | 1 → 0 | 0 |

The operation which combines the positive reading of the content stored in the ferromagnetic body 40 with the negative reading thereof is same as the Exclusive-OR operation as shown in Table 9.

TABLE 9

| Memory content | Reading data | Transition of memory content | Read data |
|---|---|---|---|
| 0 | 0 | 0 | 0 |
|   | 1 | 0 → 1 | 1 |
| 1 | 0 | 1 → 0 | 1 |
|   | 1 | 1 | 0 |

Therefore, by combining the positive reading and the negative reading, the Exclusive-OR operation can be performed. As a result, the positive reading or the negative reading is performed in accordance with the true or the false of the reading data (arithmetic data), and the result of the Exclusive-OR operation is output to the data processing section (not shown).

Figure 8C:
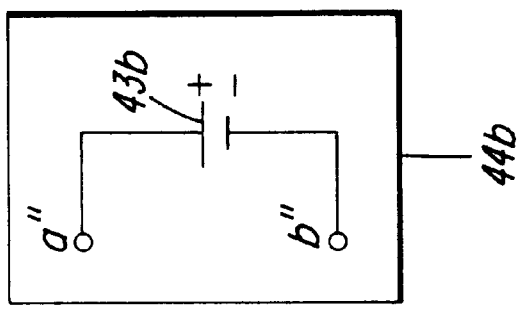
FIGS. 8A–8C are a drawing to explain the positive reading and the negative reading of the ferromagnetic body.
Figure 8B:
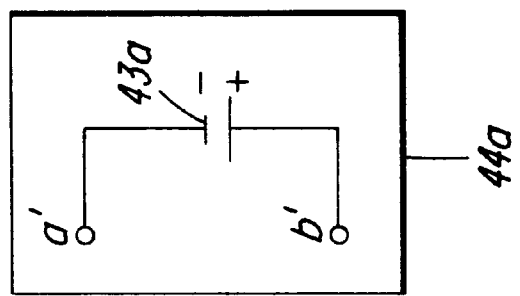
Figure 8A:
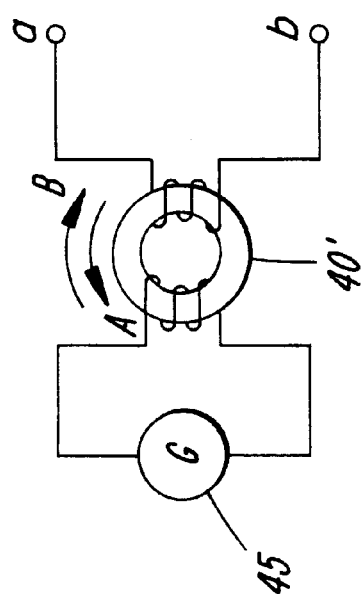

Next, the positive reading and the negative reading where the ferromagnetic body is used will be further explained with reference to FIG. 8. If the reading data is true, a data reading section 44a (FIG. 8A) having a reference power supply 43a is selected, and terminals a and b (FIG. 8A) are connected to terminals a' and b' (FIG. 8B), respectively. When a ferromagnetic body 40' (FIG. 8A) is magnetized in an A direction, the ferromagnetic body 40' is driven in a B direction opposite to the A direction and thus the change of the magnetic flux thereof occurs. When a ferromagnetic body 40' (FIG. 8A) is magnetized in a B direction, the ferromagnetic body 40' is driven in a B direction which is same as the magnetic direction thereof and thus the change of the magnetic flux thereof does not occur. In this way, the induced electromotive force thereof is detected positively as the value of "1" or "0" by a detector 45 (FIG. 8A).

On the other hand, if the reading data is false, a data reading section 44b (FIG. 8C) having a reference power supply 43b is selected, and terminals a and b (FIG. 8A) are connected to terminals a" and b" (FIG. 8C), respectively. When a ferromagnetic body 40' (FIG. 8A) is magnetized in the A direction, the ferromagnetic body 40' is driven in the A direction which is same as the magnetic direction thereof and thus the change of the magnetic flux thereof does not occur. When a ferromagnetic body 40' (FIG. 8A) is magnetized in the B direction, the ferromagnetic body 40' is driven in the A direction opposite to the A direction and thus the change of the magnetic flux thereof occurs. In this way, the induced electromotive force thereof is detected positively as the value of "1" or "0" by a detector 45 (FIG. 8A).

By reading the magnetic directions A, B positively or negatively in such a way, the same result which is same as that of the Exclusive-OR operation is obtained.

Next, the operation of the storing section in FIG. 7 will be further explained. Here, the positive logic is used, the true value of the data is "1", e.g. 5V, and the false value of the data is "0", e.g. 0V. When the data is stored in the ferromagnetic body 40 or the memory cell 30, the theoretical value 1, e.g. 5V, is given to the data writing section 32, so that the data writing section 32 gives the voltages of 5V and 0V to the data lines 41a and 41b, respectively. As a result, voltage or charge which represents the data is applied to the data lines 41a and 41b before or at the same time the address selection section 31 selects the memory cell 30.

To select the address by the address selection section 31, the voltage of 5V, for example, is applied to the gate of the NMOS transistor 39 so as to turn on the NMOS transistor 39. As a result, current flows between the source and the drain, and thus the magnetism occurs at the A direction corresponding to the theoretical value 1, for example, in accordance with the direction of the voltage or the current supplied to the ferromagnetic body 40 through the data lines 41a and 41b.

If the NMOS transistor 39 is turned off, the residual magnetic flux in the A direction is left in the ferromagnetic body 40 resulting from the hysteresis property thereof.

In case of the storing of the theoretical value 0, the voltages of 0V and 5V are given to the data lines 41a and 41b, respectively, by the data writing section 32, and the voltage or the charge is applied so as to magnetized the ferromagnetic body 40 in the B direction corresponding to the theoretical value 0 opposite to the writing of the theoretical value 1. Thereby, the data corresponding to the theoretical value 0 is stored in the ferromagnetic body 40 by the residual magnetic flux in the D direction.

If the data is read positively, the ferromagnetic body 40 is driven in the direction opposite to that of the voltage or the current of the written data so as to read the same value as that of the stored data. For example, the voltages of 0V and 5V are given to the data lines 41a and 41b, respectively, the address selection is performed at the same time the data are read so as to turn on the NMOS transistor 39, and thus the ferromagnetic body 40 is driven. In this way, the memory content thereof can be detected by the sense amplifier 42.

For example, in the case where the theoretical value 1 is stored in the ferromagnetic body 40 as the residual magnetic flux in the A direction, the ferromagnetic body 40 is magnetized in the D direction so as to change the magnetic flux thereof, the change thereof is induced as the electromotive force in accordance with the electromagnetic induction. By detecting the change thereof by the sense amplifier 42, the theoretical value 1 of the memory content is read.

Similarly, in the case where the theoretical value 0 is stored, the change of the residual magnetic flux does not occur even if the direction of the magnetic flux changes in the direction B, for example, for reading because the theoretical value 0 is stored in the ferromagnetic body 40 as the residual magnetic flux in the B direction. Therefore, there is no electromotive force to be induced, and the theoretical value 0 is obtained from the sense amplifier 42. Here, a destructive reading means that the data in the ferromagnetic body 40 is read by changing the magnetic flux thereof until the residual magnetic flux therein is destroyed. A non-destructive reading means that the data therein is read so as not to destroy the residual magnetic flux therein, for example, using one half of current or voltage necessary to perform the destructive readout mode, and then is restored in the original storing state without the magnetic flux.

If the data is read negatively, there is no change of the magnetic flux when the ferromagnetic body is driven in the direction same as the writing direction thereof, for example, the A direction corresponding to the storing of the logic value 1, the sense amplifier 42 outputs the negative logic value 0 of the storing data. On the other hand, if the residual magnetic flux corresponding to the logic value 0 of the storing data is stored in the D direction, for example, the change of the magnetic flux occurs, and the negative logic value 1 of the storing data is obtained from the sense amplifier.

Figure 9:
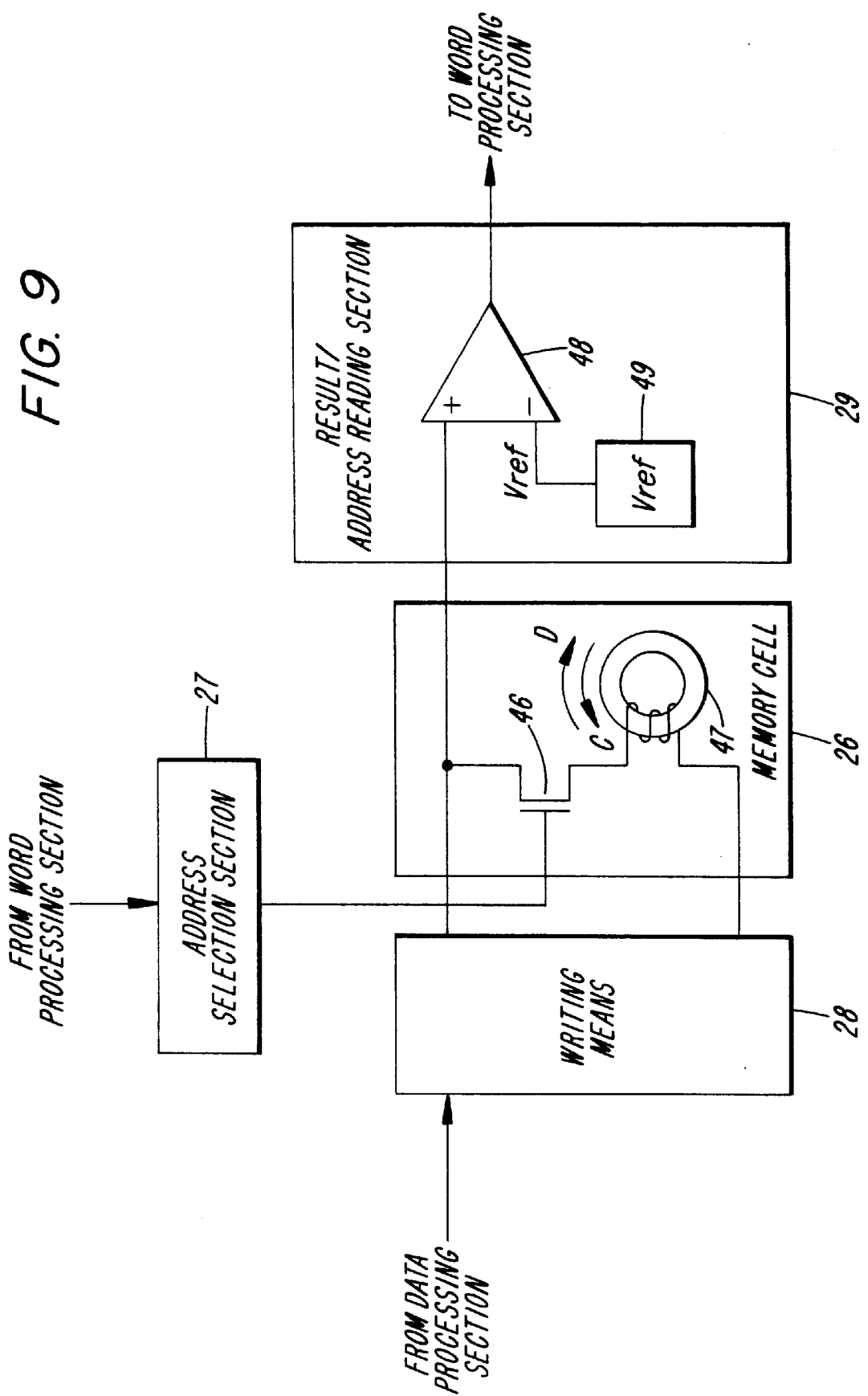
FIG. 9 is a schematic diagram showing an example of the storing section shown in FIG. 4.

FIG. 9 is a schematic diagram showing an example of the storing section shown in FIG. 4. In FIG. 9, same reference numerals as those in FIG. 5 are used, but only one memory cell 30 is shown. In the example, the memory cell 26 has an NMOS transistor 46, and a ferromagnetic body 47 which composes a magnetic circuit by being wound with a lead wire connected to the NMOS transistor 46. The data writing section 28 has same construction and operation as those of the data writing section 32 (FIG. 7). The result/address reading section 29 comprises a sense amplifier 48 having a non-inverting input and an inverting input. The non-inverting input is connected to a lead wire which winds around the ferromagnetic body 47. The non-inverting input is also connected to the data writing section 28, the inverting input is connected to a reference power supply 49, and an output thereof is connected to the word processing section 11 (FIG. 2) or 20 (FIG. 3).

Figure 10:
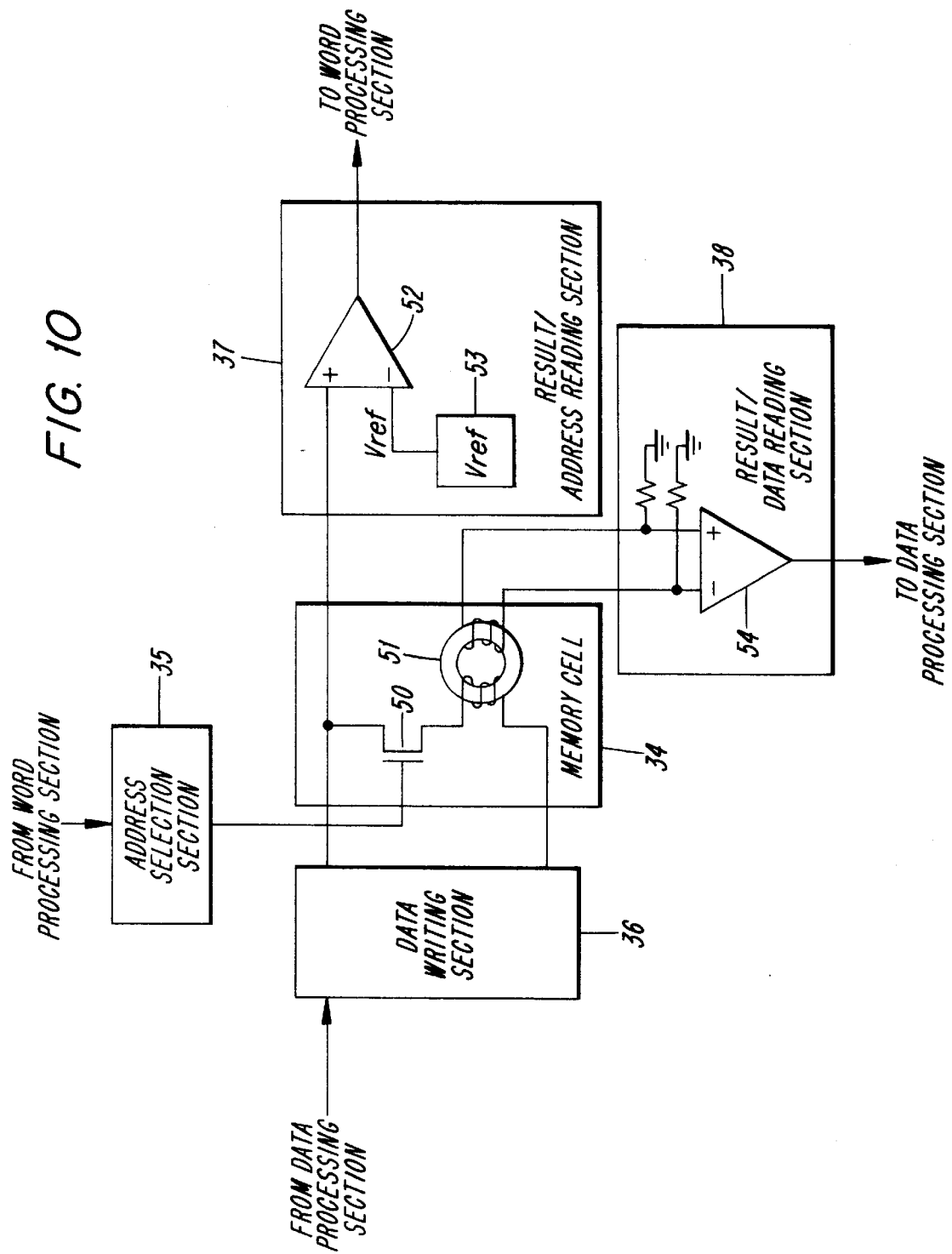
FIG. 10 is a schematic diagram showing an example of the storing section shown in FIG. 6.

FIG. 10 is a schematic diagram showing an example of the storing section shown in FIG. 6. In FIG. 10, same reference numerals as those in FIG. 6 are used, but only one memory cell 34 is shown. In the example, the memory cell 34 has an NMOS transistor 50 corresponding to the NMOS transistor 46 (FIG. 9), and a ferromagnetic body 51 corresponding to the ferromagnetic body 47 (FIG. 9). The result/ address reading section 37 has a sense amplifier 52 corresponding to the sense amplifier 42 (FIG. 7), and a reference power supply 53 corresponding to the reference power supply 43 (FIG. 7). The result/data reading section 38 has a sense amplifier 54 corresponding to the sense amplifier 49 (FIG. 9).

Figure 11:
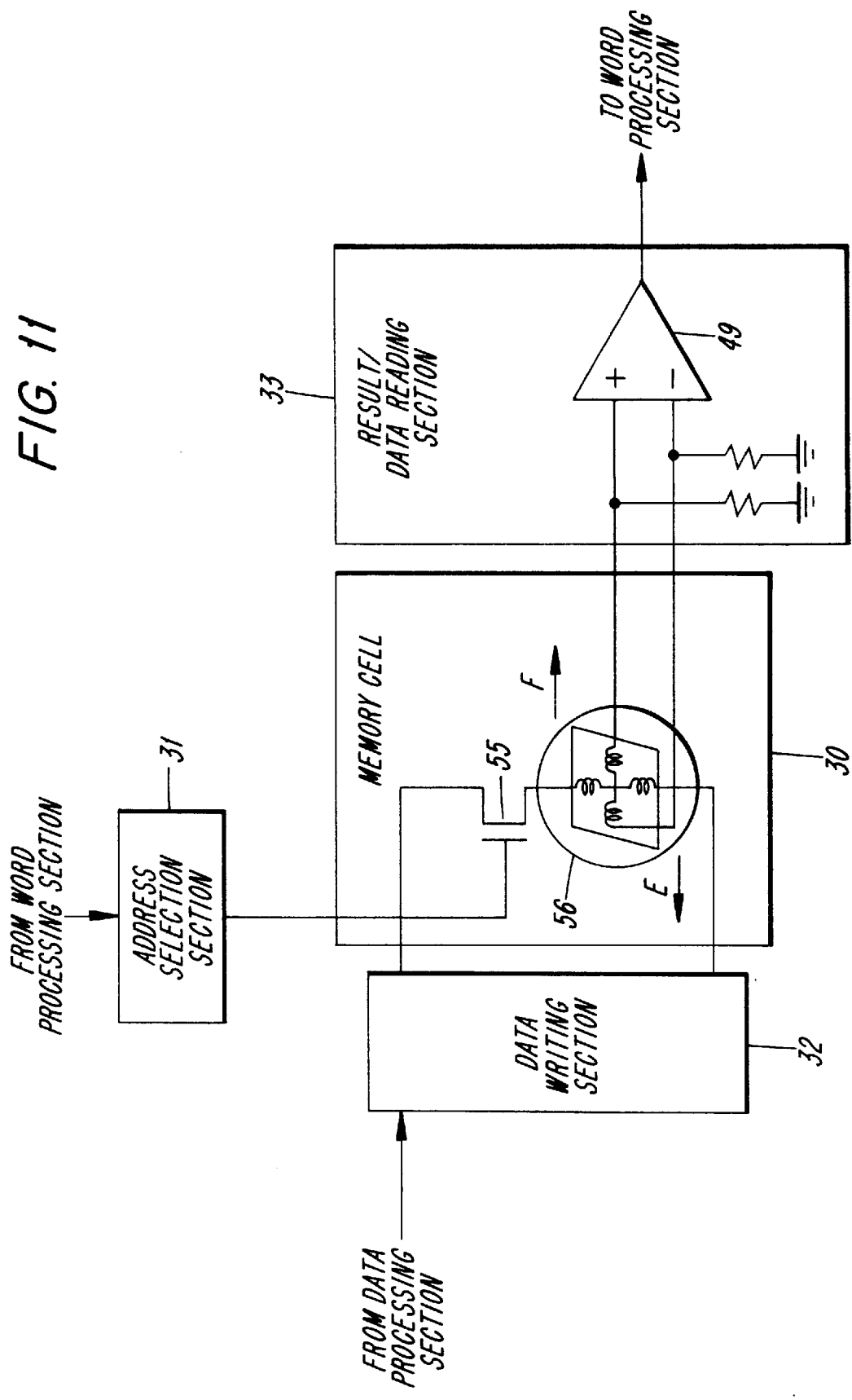
FIG. 11 is a schematic diagram showing another example of the storing portion shown in FIG. 5.

FIG. 11 is a schematic diagram showing another example of the storing portion shown in FIG. 5. In FIG. 11, same reference numerals as those in FIGS. 5 and 9 are used, but only one memory cell 30 is shown. In the example, the memory cell 30 has an NMOS transistor 55 corresponding to the NMOS transistor 46 (FIG. 9), and a ferromagnetic thin film 56 (e.g. permalloy).

In this case, the magnetic flux thereof is inverted by rotation of the magnetization vector thereof. Thereby, the first value (e.g. 1) corresponds to a first magnetization vector E, and the second value (e.g. 0) corresponds to a second magnetization vector F having direction opposite to that of the first magnetization vector E, so that storing operation with 1-bit is performed.

Figure 12:
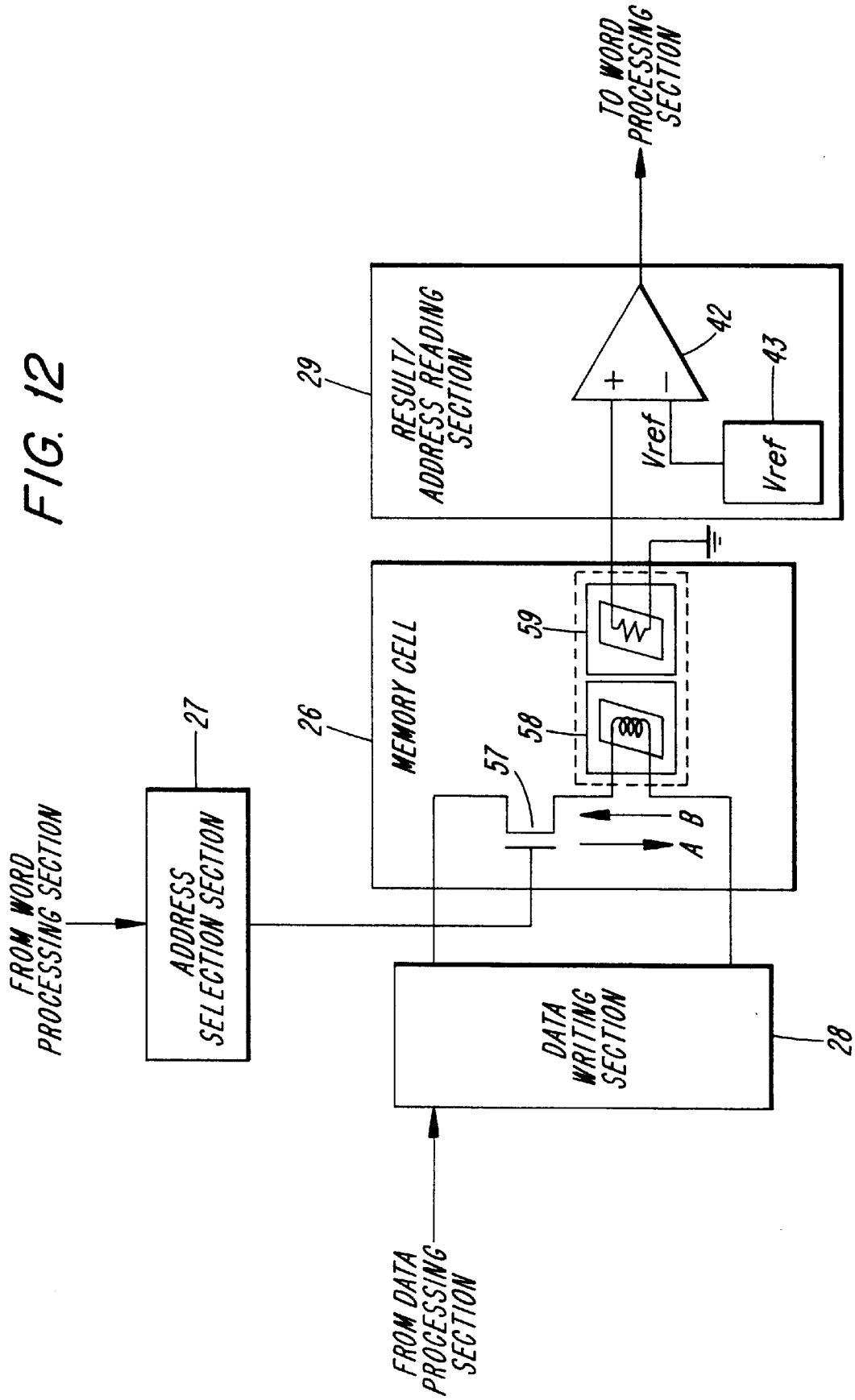
FIG. 12 is a schematic diagram showing another example of the storing section shown in FIG. 4.

FIG. 12 is a schematic diagram showing another example of the storing section shown in FIG. 4. In FIG. 12, same reference numerals as those in FIGS. 4 and 7 are used, but only one memory cell 26 is shown. In the example, the memory cell 26 has an NMOS transistor 57 corresponding to the NMOS transistor 46 (FIG. 9), a non-volatile ferromagnetic body 58, and a magnetic resistive element 59 which reads the storage of the non-volatile ferromagnetic body 58.

Such a storing section utilizes the non-volatile magnetic hysteresis thereof, and it is realized so that it can select the destructive readout mode, the non-destructive readout mode, or both of them by controlling the drive current or the drive voltage thereof. If the destructive readout mode is selected, the rewriting operation thereof must be performed. The reading and writing operation thereof is similar to those of the storing section shown in FIGS. 7 to 12.

Figure 13:
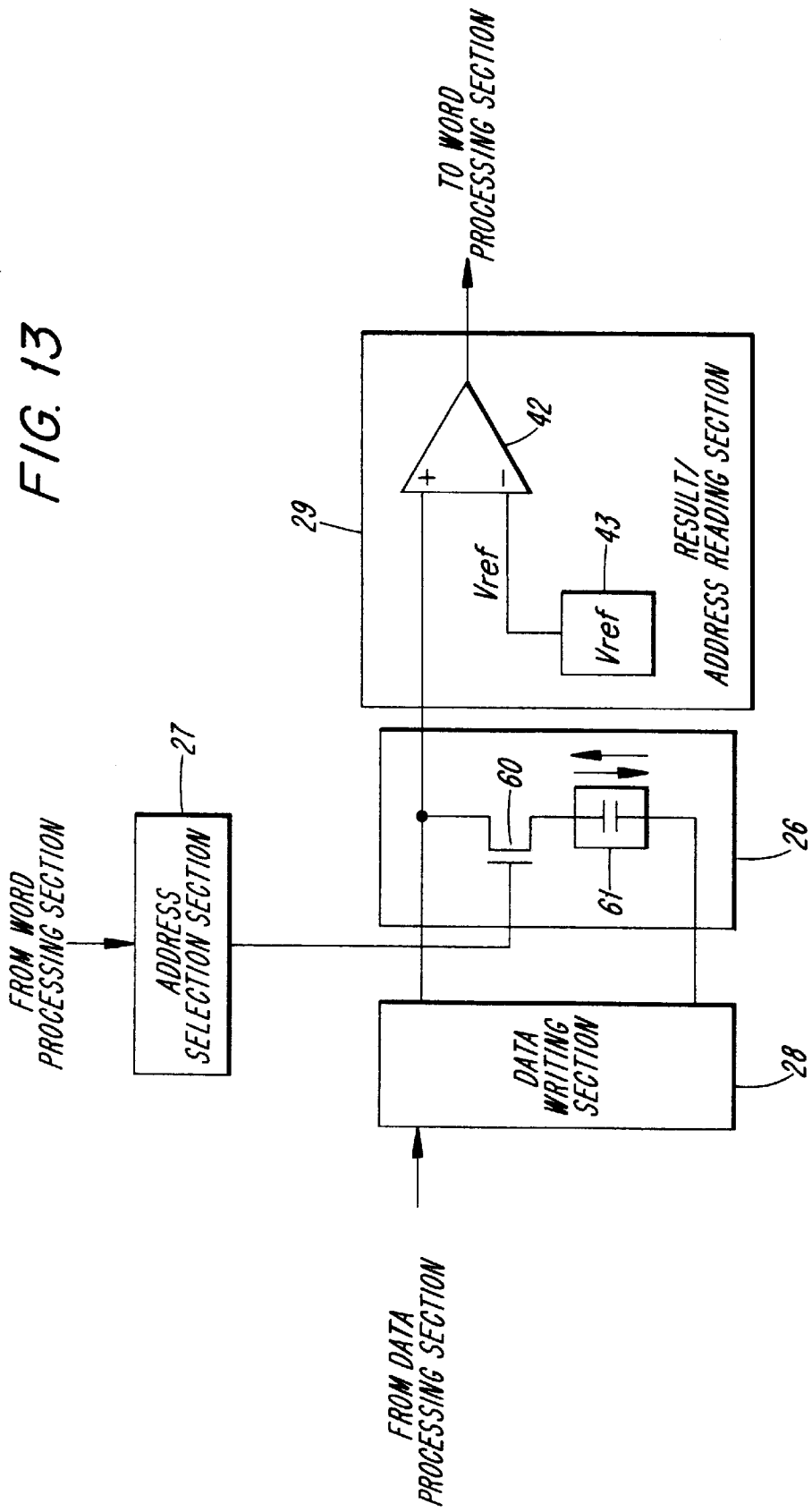
FIG. 13 is a schematic diagram showing another example of the storing section shown in FIG. 4.

FIG. 13 is a schematic diagram showing another example of the storing section shown in FIG. 4. In FIG. 13, same reference numerals as those in FIGS. 4 and 7 are used, but only one memory cell 26 is shown. In the example, the memory cell 26 has an NMOS transistor 60 corresponding to the NMOS transistor 46 (FIG. 9), and a ferroelectric body 61 having non-volatile and hysteresis properties.

The positive and negative readings of the ferroelectric body will be explained with reference to FIG. 14. If the data read therefrom is true, a data reading section 63a (FIG. 14B) having a reference power supply 62a is selected, terminals c and d (FIG. 14A) are connected to terminals c' and d', respectively, the potential of a ferroelectric body 61' (FIG. 14A) is compared with that of a reference power supply 62a (FIG. 14B), and the difference or the equivalence therebetween is detected positively by a detector 64a (FIG. 14B).

Figure 14C:
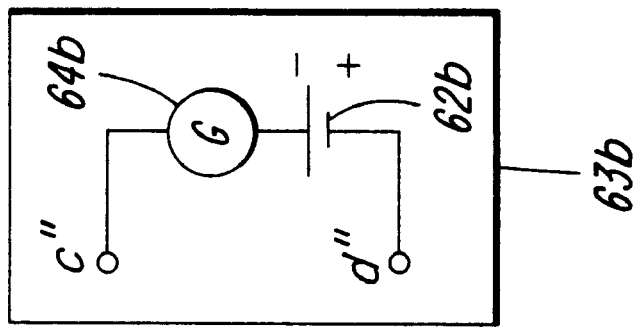
FIGS. 14A–14C is a drawing to explain the positive reading and the negative reading of the ferroelectric body.
Figure 14B:
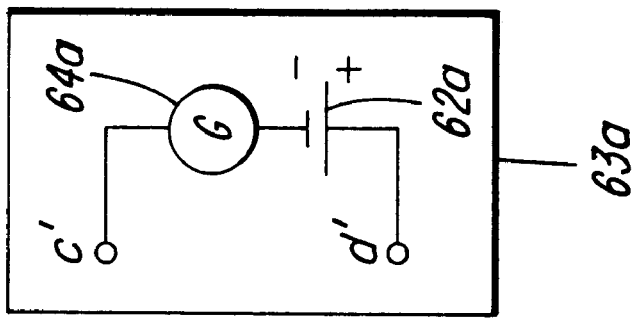
Figure 14A:
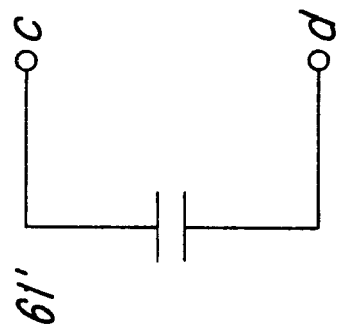

On the other hand, If the data read therefrom is false, a data reading section 63b (FIG. 14C) having a reference power supply 62b is selected, terminals c and d (FIG. 14A) are connected to terminals c" and d", respectively, the potential of a ferroelectric body 61' (FIG. 14A) is compared with that of a reference power supply 62b (FIG. 14C), and the difference or the equivalence therebetween is detected positively by a detector 64b (FIG. 14C).

By performing the positive and negative readings of the ferroelectric body in such a way, the same result as that of the Exclusive-OR operation is obtained. The reading and writing operation thereof is similar to those of the storing section shown in FIG. 7.

Figure 15:
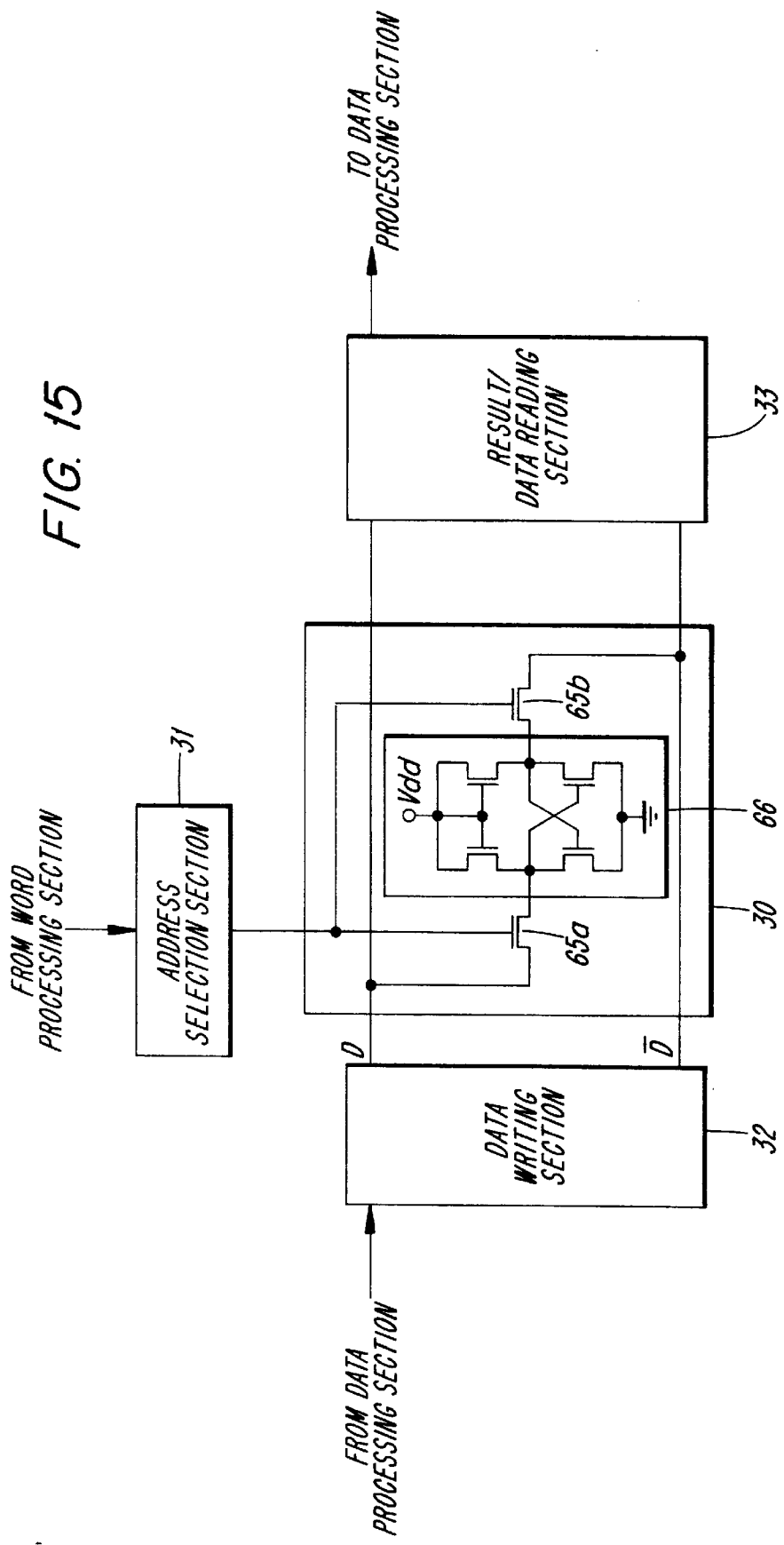
FIG. 15 is a schematic diagram showing another example of the storing portion shown in FIG. 5.

FIG. 15 is a schematic diagram showing another example of the storing portion shown in FIG. 5. In FIG. 15, same reference numerals as those in FIG. 5 are used, but only one memory cell 30 is shown. In the example, the memory cell 30 has NMOS transistors 65a and 65b, and a data storing section 66 composed of a semiconductor flip-flop which has non-volatile and hysteresis properties. The reading and writing operation thereof is similar to those of the storing section shown in FIG. 7.

According to the embodiment, the data written into the data storing section as the positive or negative logic data in accordance with the true or false value of the data for identity-retrieval, it is possible to operate the Exclusive-OR of the data written into the data storing section and the identity-retrieval data without having an additional Exclusive-OR operation circuit in the memory cell.

While the present invention has been described above with reference to certain preferred embodiments, it should be noted that they were present by way of examples only and various changes and/or modifications may be made without departing from the scope of the invention. For example, when reading the data positively, it is possible to perform the negative reading of the data written into the ferromagnetic body, the ferroelectric body or the like negatively instead of performing the positive reading of the data written into the ferromagnetic body, the ferroelectric body or the like positively. Moreover, when reading the data negatively, it is possible to perform the negative reading of the data written into the ferromagnetic body, the ferroelectric body or the like positively instead of performing the negative reading of the data written into the ferromagnetic body, the ferroelectric body or the like positively.

What is claimed is:

1. A method of reading a data memory device having an Exclusive-OR function, said device being adapted to calculate an Exclusive-OR of a data written into a storing section of at least one memory cell, and an identity-retrieval data, said method comprising the steps of:

inputting said identity-retrieval data and the data to be stored; and reading the data written into said storing section as one of a first logic data and a second logic data if said identity-retrieval data has a true value, and as the other of said first and second logic data if said identity-retrieval data has a false value.

2. The method according to claim 1, further comprising the steps of:

comparing, when said identity-retrieval data has the true value, a potential of said storing section with a first reference potential and outputting a true value if a difference is detected between said potential of the storing section and said first reference potential, and outputting a false value if a difference is not detected between said potential of the storing section and said first reference potential; and comparing, when said identity-retrieval data has the false value, the potential of said storing section with a second reference potential having a polarity which is opposite to that of said first reference potential, and outputting a true value if a difference is detected between said potential of the storing section and said second reference potential, and outputting a false value if a difference is not detected between said potential of the storing section and said second reference potential.

3. The method according to claim 1, further comprising the steps of:

comparing, when said identity-retrieval data has the true value, a potential of said storing section with a first reference potential and outputting one of a false value if a difference is detected between said potential of the storing section and said first reference potential, and outputting a true value if a difference is not detected between said potential of the storing section and said first reference potential; and comparing, when said identity-retrieval data has the false value, the potential of said storing section with a second reference potential having a polarity which is opposite to that of said first reference potential, and outputting a false value if a difference is detected between said potential of the storing section and said second reference potential, and outputting a true value if a difference is not detected between said potential of the storing section and said second reference potential.

4. A memory device having an Exclusive-OR function, comprising:

storing means having memory cells, each of which having a storing section adapted to store a data as one of a true value and a false value;

input means for inputting a) the data to be stored in at least one of said memory cells and b) an identity-retrieval data;

writing means for writing the data, input through said input means, into at least one of said memory cells separately or simultaneously, as one of first and second logic data;

reading means for reading the data stored in at least one of said memory cells separately or simultaneously;

selecting means for selecting at least one of said memory cells from which the data is to be read, and at least one of said memory cells in which the data is to be stored; and output means for outputting the data read by said reading means;

wherein said reading means being adapted to read the data stored in said storing section as one of said first logic data and said second logic data if said identity-retrieval data has the true value, and as the other of said first logic data and said second logic data if said identity-retrieval data has the false value.

5. The device according to claim 4, wherein said reading means is adapted to compare, when said identity-retrieval data has the true value, a potential of said storing section with a first reference potential and output a true value if a difference is detected between said potential of the storing section and said first reference potential, and output a false value if a difference is not detected between said potential of the storing section and said first reference potential, and is also adapted to compare, when said identity-retrieval data has the false value, the potential of said storing section with a second reference potential having a polarity which is opposite to that of said first reference potential, and output a true value if a difference is detected between said potential of the storing section and said second reference potential, and output a false value if a difference is not detected between said potential of the storing section and said second reference potential.

6. The device according to claim 4, wherein said reading means is adapted to compare, when said identity-retrieval data has the true value, a potential of said storing section with a first reference potential and output a false value if a difference is detected between said potential of the storing section and said first reference potential, and output a true value if a difference is not detected between said potential of the storing section and said first reference potential, and is also adapted to compare, when said identity-retrieval data has the false value, the potential of said storing section with a second reference potential having a polarity which is opposite to that of said first reference potential, and output a false value if a difference is detected between said potential of the storing section and said second reference potential, and output a true value if a difference is not detected between said potential of the storing section and said second reference potential.

7. The device according to claim 4, further comprising current control means for controlling a current therethrough in both directions when the data is read from said storing section or written into said storing section.

8. The device according to claim 4, wherein said storing section comprises a ferroelectric body for holding data according to a direction of polarization of the ferroelectric body.

9. The device according to claim 4, wherein said storing section comprises a dielectric body for holding data according to a direction of polarization of the dielectric body.

10. The device according to claim 4, wherein said storing section comprises a flip-flop for holding data according to a conductive condition and an interrupting condition of the flip-flop.

11. The device according to claim 4, wherein said storing section comprises a ferromagnetic body for holding the data of the true value or the false value according to a magnetizing direction or a magnetizing strength thereof;

said writing means being adapted to write the data into said storing section separately or simultaneously in accordance with an electromagnetic induction generated by said ferromagnetic body; and said reading means being adapted to read the data from said storing section separately or simultaneously in accordance with said electromagnetic induction.

12. The device according to claim 11, wherein one of said true value and said false value indicating the potential of said storing section corresponds to a first residual magnetism with a magnetic field in said ferromagnetic body being zero, and the other of said true value and said false value indicating the potential of said storing section corresponds to a second residual magnetism with the magnetic field in said ferromagnetic body being zero, wherein the magnetizing strength of said first residual magnetism is substantially same as that of said second residual magnetism and said first residual magnetism has a sign which is opposite to that of said second residual magnetism.

13. The device according to claim 11, wherein said ferromagnetic body comprises a ferromagnetic thin film having a first magnetization vector corresponding to one of said true value and said false value indicating the potential of said storing section, and a second magnetization vector corresponding to the other of said true value and said false value indicating the potential of said storing section and having a direction opposite to that of said first magnetization vector.

* * * * *